United States Patent [19]

Inoue et al.

[11] Patent Number: 5,436,080

[45] Date of Patent: Jul. 25, 1995

[54] HIGH STRENGTH STRUCTURAL MEMBER AND PROCESS FOR PRODUCING THE SAME

[75] Inventors: Akihisa Inoue, Jutaku, 11-806, Kawauchi, Aoba-ku; Tsuyoshi Masumoto, 8-22, Kamisugi 3-chome, Aoba-ku, both of Sendai-shi, Miyagi-ken; Jun Sasahara; Katsutoshi Nosaki, both of Saitama; Tadashi Yamaguchi, Miyagi, all of Japan

[73] Assignees: Tsuyoshi Masumoto; Akihisa Inoue, both of Miyagi; Yoshida Kogyo K.K.; Honda Giken Kogyo Kabushiki Kaisha, both of Tokyo, all of Japan

[21] Appl. No.: 943,324

[22] Filed: Sep. 10, 1992

[30] Foreign Application Priority Data

| Sep. 13, 1991 | [JP] | Japan | 3-261460 |
| Sep. 13, 1991 | [JP] | Japan | 3-261461 |
| Sep. 13, 1991 | [JP] | Japan | 3-261462 |
| Sep. 13, 1991 | [JP] | Japan | 3-261463 |
| Sep. 13, 1991 | [JP] | Japan | 3-261464 |

[51] Int. Cl.$^6$ .............................................. B22F 3/00
[52] U.S. Cl. .................................... 428/546; 428/570; 419/23; 419/35; 419/13
[58] Field of Search ............... 419/13, 23, 35; 427/217, 250, 251, 585; 428/546, 570

[56] References Cited

U.S. PATENT DOCUMENTS

| 2,853,398 | 4/1956 | Mackiw et al. | 427/217 |
| 4,440,800 | 4/1984 | Morton et al. | 427/13 |
| 4,818,567 | 4/1989 | Kemp, Jr. et al. | 427/217 |
| 5,183,631 | 2/1993 | Kugimiya et al. | 419/10 |
| 5,223,213 | 6/1993 | Kamimura et al. | 419/35 |

*Primary Examiner*—Donald P. Walsh
*Assistant Examiner*—Anthony R. Chi
*Attorney, Agent, or Firm*—Lyon & Lyon

[57] ABSTRACT

A structural member is produced using starting powder consisting of composite particulates each containing AlN grain within its surface covered by an Al layer of a single crystal structure, and Al alloy particulates of a single crystal structure, and then by sintering the Al layers of the composite particulates with the Al alloy particulates. The Al layers and the Al alloy particulates of the single crystal structure have no dislocation fault, crystal grain boundary. etc., produced therein, and for this reason, they have a low chemical activity. Therefore, the Al layers and the like have a characteristic that they are extremely difficult to oxidize. This ensures that the Al layers and the Al alloy particulates can be reliably sintered to achieve the densification of the resulting structural member.

37 Claims, 8 Drawing Sheets

HIGH STRENGTH STRUCTURAL MEMBER AND PROCESS FOR PRODUCING THE SAME

BACKGROUND OF THE INVENTION

FIELD OF THE INVENTION

The present invention relates to a high strength structural member for use as various mechanical parts or the like, and to a process for producing the same.

DESCRIPTION OF THE PRIOR ART

There is a conventionally known structural member which is produced by powder metallurgy using metal-based particulates such as composite particulates containing ceramic grains each having a surface coated by a metal layer through a metal coating treatment, and metal-simple particulates. In this case, very fine metal grains are employed in order to achieve an increase in strength of the structural member.

The metal grains in the conventional structural member, however, are accompanied by a problem that the grain size thereof is small and has a large surface energy whereby, for this reason, the surfaces of the grains are liable to be oxidized due to high chemical activity. As a result, oxide layers on the grain surfaces disturb the sintering between the grains and hence, using a sintering treatment under no pressure, a structural member having a high density and thus a high strength cannot be produced.

The conventional composite particulates are also accompanied by a problem that the bond strength between the ceramic grain and the metal layer is low, because of a poor wettability therebetween, and the difference in thermal expansion between the ceramic grain and the metal layer is also large. Therefore, it has been impossible to increase the strength of the structural member, and particularly the strength at an increased temperature, to a desired extent.

On the other hand, there is a conventionally known process for producing a structural member of the type described above, which comprises the steps of: forming a blank by use of metal-based particulates by compacting them, and subjecting the blank to a sintering treatment. With this conventional process, however, there is a problem that because the substantially spherical metal-based particulates are employed, the porosity of the blank is liable to be high, and as a result, it is difficult to produce a blank having a high density.

If very fine metal-based particulates are used in order to avoid this problem, then it fails to increase the density of the resulting blank to an expected extent, because the residue of air is increased. Therefore, in the conventional process there is a limit to providing an increase in strength of the structural member.

Another conventionally known process for producing a structural member of the type described above comprises the steps of: forming a billet by use of metal-based particulates and subjecting the billet to an extrusion to provide a structural member. The metal-based particulates each have an oxide layer on the surface thereof, and the oxide layer is a factor in disturbing the bonding between the metal-based particulates. As a result, it is a conventional practice to apply, during extrusion, a pressing force to the metal-based particulates to destroy the oxide layers. Even in this case, however, there is encountered a problem that because the conventional metal-based particulates are substantially spherical, a slipping occurs among the particulates, thereby making it impossible to sufficiently destroy the oxide layers. As a result, it is difficult to provide an increase in strength of the structural member.

A further conventionally known process for producing a structural member of the type described above comprises the steps of: extruding starting powder consisting of metal-simple particulates and ceramic grains. With a grain-reinforced type structural member, in order to insure an increase in strength by ceramic grains while maintaining the ductility of the metal, it is necessary to employ extremely fine ceramic grains and to uniformly disperse the fine ceramic grains in a metal matrix. With this conventional process, however, there is encountered a problem that when fine ceramic grains are used, they are liable to be coagulated together, because of the large surface energy thereof, and this tendency is intensified with an increase in volume fraction Vf of the ceramic grains, resulting in difficulty in producing a structural member having the desired strength. As a result, it is a conventional practice to cover the ceramic grain surfaces by metal layers, but the finer the ceramic grains are, the more difficult the covering is.

SUMMARY OF THE INVENTION

It is an object of the present invention to provide a high strength structural member of the type described above, which is produced using, as a component, metal-based particulates, each of which has a particular crystal structure at least at its surface side. To achieve this object, according to the present invention, there is provided a high strength structural member in which metal-based particulates each formed, at least at its surface side, of a metal having a single crystal structure are bonded together.

It is another object of the present invention to provide a high strength structural member of the type described above, which is produced using composite particulates having an increased bond strength between each ceramic grain and each metal layer and a moderated difference in thermal expansion between both of them. To achieve this object, according to the present invention, there is provided a high strength structural member wherein at least some of the metal-based particulates are composite particulates each comprising a ceramic grain with its surface covered by a metal layer of a single crystal structure.

By employing composite particulates having such single crystal structure, it is possible to provide a high strength structural member having a high bond strength between the ceramic grains and the metal matrix.

It is a further object of the present invention to provide a producing process of the type described above wherein an increase in density of a blank can be achieved by employing metal-based particulates having a particular shape, thereby producing a high strength structural member. To achieve this object, according to the present invention, there is provided a process for producing a high strength structural member, comprising the steps of forming a blank under pressure by use of starting powder comprised of polyhedron-shaped metal-based particulates, at least some of the particulates being formed, at least at their surface sides, of metal having a single crystal structure, and subjecting the blank to a sintering treatment.

It is a yet further object of the present invention to provide a producing process of the type described above, wherein the destruction of any oxide layers can be performed sufficiently by using metal-based particulates of a particular shape as at least a portion of the starting powder. To achieve this object, according to the present invention, there is provided a process for producing a high strength structural member, comprising the steps of: forming a blank by use of starting powder, at least some of the starting powder being polyhedron-shaped metal-based particulates, each of the particulates being formed, at least at its surface side, of a metal having a single crystal structure, and subjecting the blank to a fabrication under a pressure. It is possible to sufficiently destroy any oxide layers on the particulate surfaces and to promote the plastic deformation of the metal portions by use of the metal-based particulates of a particular shape as at least a portion of the starting powder, thereby producing a high strength structural member.

Further, it is an object of the present invention to provide a producing process of the type described above, wherein a reduction in fineness of and the uniform dispersion of the ceramic grains can be easily achieved, thereby producing a high strength structural member. To achieve this object, according to the present invention, there is provided a process for producing a high strength structural member, comprising the steps of: producing ceramic grains by a reaction of a metal vapor with an atmosphere gas, covering the surfaces of the ceramic grains by metal layers of a single crystal structure produced from the metal vapor, thereby providing composite particulates each comprised of the ceramic grain and the metal layer, and bonding the metal layers of the composite particulates together. It is possible to produce a high strength structural member containing the very fine ceramic grains uniformly dispersed therein by using the process specified as described above.

The above and other objects, features and advantages of the invention will become apparent from a consideration of the following description of the preferred embodiments taken in conjunction with the accompanying drawings.

DESCRIPTION OF THE PREFERRED EMBODIMENTS

Figure 1:
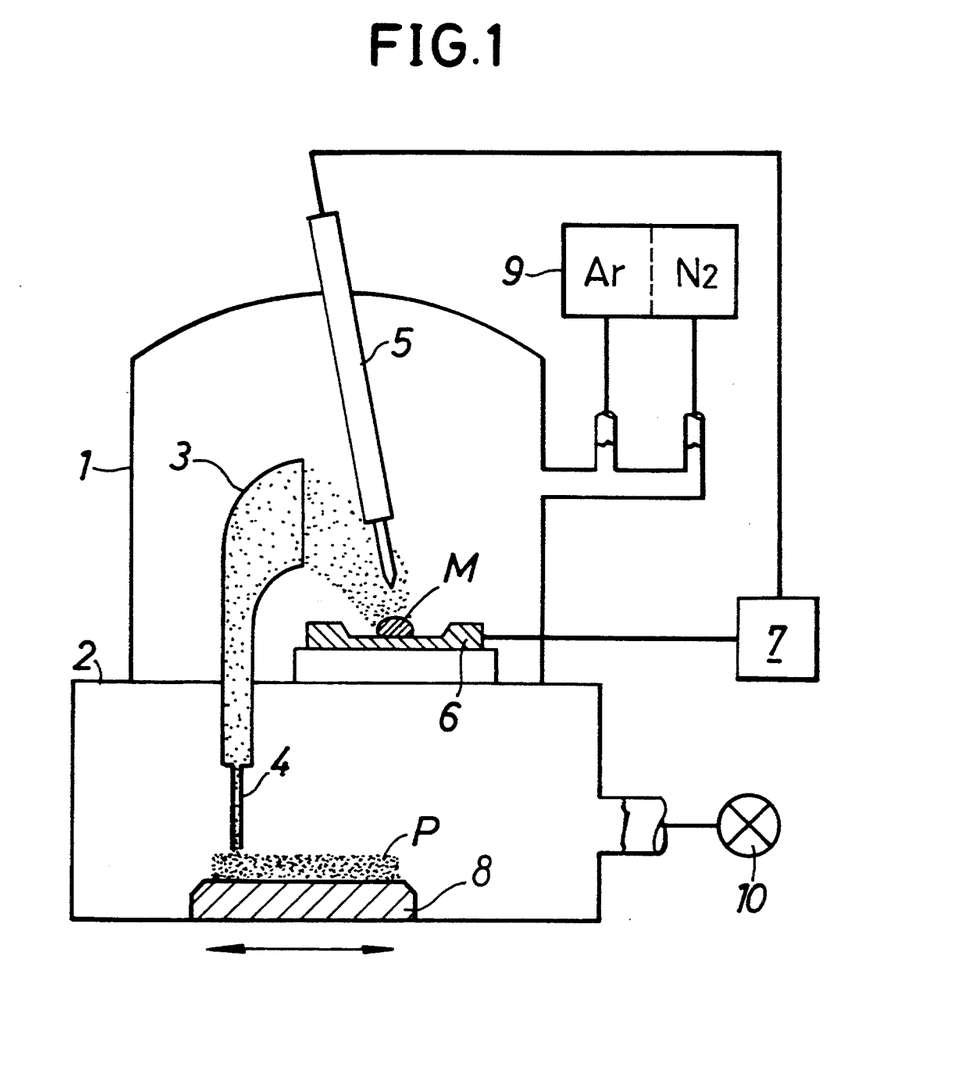
FIG. 1 is a diagrammatical sectional view of an apparatus for producing composite particulates.

FIG. 1 illustrates an apparatus for use in the production of composite particulates as metal-based particulates. Each of the composite particulates comprises a ceramic grain of a single crystal structure and a metal layer of a single crystal structure which covers the surface of the ceramic grain core.

This producing apparatus includes a main chamber 1 and a subsidiary chamber 2 provided below the main chamber 1. The chambers 1 and 2 are connected to each other through a duct 3 and a nozzle 4 mounted to a lower end of the duct 3. A W-electrode 5 inserted into the main chamber 1 and a hearth 6 of copper placed within the main chamber 1 are connected to a power source 7. A movable substrate 8 is disposed within the subsidiary chamber 2 and below the nozzle 4. The main chamber 1 is connected to a predetermined and controlled atmosphere gas supply source 9, while the subsidiary chamber 2 is connected to a vacuum pump 10.

The composite particulates may be produced by using a procedure comprising the following steps (1) to (5):

(1) placing a metal mass M into the hearth 6;

(2) operating the vacuum pump 10 to depressurize the interior of the subsidiary chamber 2;

(3) operating the atmosphere gas supply source 9 to supply an atmosphere gas into the main chamber 1, and injecting such atmosphere gas into the subsidiary chamber 2 via the duct 3 and through the nozzle 4; and (4) applying a voltage between the W-electrode 5 and the hearth 6 to generate an arc discharge, thereby melting the metal mass M to produce a metal vapor.

The metal vapor reacts with the atmosphere gas, thereby producing polyhedron-shaped super-fine composite particulates P each containing a ceramic grain with its surface covered by a metal layer. In the course of the production of such composite particulates P, the reaction of the metal vapor with the atmosphere gas causes a phenomenon that the polyhedron-shaped ceramic grains of a single crystal structure are first produced, and the metal vapor deposited onto the surfaces of the ceramic grains is then epitaxially-grown to form the polyhedron-shaped metal layers of a single crystal structure.

In this case, the form of the grown metal crystals are defined by the crystal structure peculiar to the metal. If the metal is of a simple cubic structure, the grown metal crystals are in the form of a cube. If the metal is of a body-centered cubic structure, the grown metal crystals are in the form of a diamond dodecahedron. Further, if the metal is of a face-centered cubic structure, the grown metal crystal is in the form of a regular octahedron. Therefore, a face which has a large density of atoms packed therein and which has been grown at a slower speed appears on a surface of the grown metal crystal and hence, each composite particulate P is in the form of a polyhedron.

(5) Then, the resulting composite particulates are injected through the duct 3 and the nozzle 4 onto the substrate 8 and deposited on the substrate 8.

The metal layer or the like of the single crystal structure has no dislocation, fault, crystal grain boundary, etc., produced therein, and for this reason, it has a low chemical activity and hence, has a characteristic that it is extremely hard to oxidize.

The ceramic grain is preferably one having an aspect ratio. In this case, the aspect ratio is represented by L/D, wherein L indicates the length, and D indicates the grain size. Therefore, the ceramic grain is non-spherical and substantially short column-shaped.

The grain reinforcing mechanism in a structural member is a mechanism in which the metal matrix surrounding the grains receives a strain due to the presence of the grains, and any cracks, dislocations or the like upon destruction may be caught by such strain and inhibited from being propagated. Therefore, with the ceramic grain which is substantially short column-shaped rather than spherical, a larger strain is provided to the surrounding metal matrix and hence, the propagation of the dislocations and the like can be further inhibited.

The metal mass M which may be used is a simple or alloy of Fe, Al, Ti and the like. The atmosphere gas which may be used is nitrogen ($N_2$) gas, oxygen ($O_2$) gas, methane ($CH_4$) gas, di-boron gas and the like, and optionally, argon gas (Ar) may be also used in combination with the above described gas. Therefore, the ceramic grain is a nitride, carbide, boride or oxide of the metal.

A particular example of polyhedron-shaped composite particulates will be described below.

By the above-described producing process using the apparatus shown in FIG. 1, composite particulates P were produced under conditions of a pressure of $10^{-2}$ Torr within the subsidiary chamber 2 and a diameter of 0.8 mm of the nozzle 4, using a pure aluminum as a metal mass M and using nitrogen gas having a purity of 99.99% and argon gas having a purity of 99.99% as an atmosphere gas supply.

Figure 2:
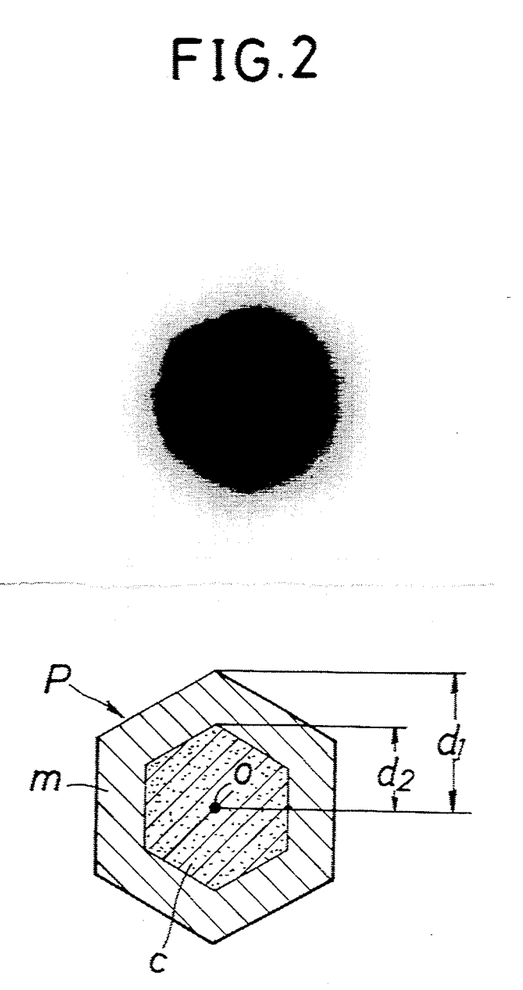
FIG. 2 is a photomicrograph showing the crystal structure of the composite particulate.
Figure 3:
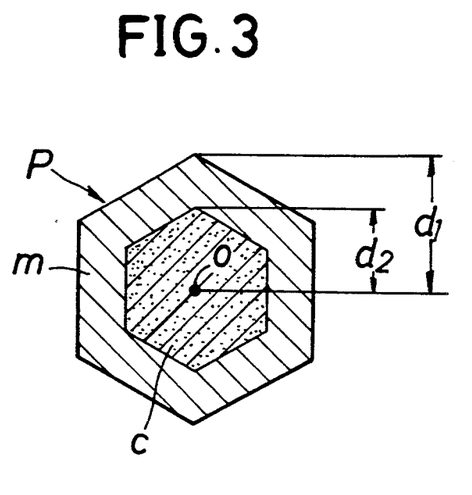
FIG. 3 is a diagrammatical cross-sectional view of the composite particulate.

FIG. 2 is a microphotograph photomicrograph (300,000X magnification) showing the crystal structure of a polyhedron-shaped composite particulate P, and FIG. 3 diagrammatically shows the composite particulate P corresponding to that in FIG. 2 in cross-section. The composite particulate P comprises an octahedron-shaped AlN grain (ceramic grain) c having a single crystal structure and a hexagonal cross-section, and an octahedron-shaped Al layer (metal layer) m which has a single crystal structure and a hexagonal cross-section and which covers the surface of the octahedron-shaped AlN grain c. The Al layer m was epitaxially-grown on the surface of the AlN grain c, wherein the relationship in crystal orientation between the Al layer m and the AlN grain m is [111]Al//[011]AlN, [101]Al//[110]AlN, and [121]Al//[110]AlN. This results in an increased bond strength between AlN grain c and the Al layer m. The AlN grain c has a certain level of aspect ratio in an axial direction of c and assumes the form of a substantially short hexagonal column.

In each of various composite particulates P, the relationship between the partial pressure of the gas and the composite ratio is as given in Table 1. It should be noted that the composite ratio is represented by $d_2/d_1$, wherein $d_1$ represents a distance between the center o of the composite particulate P and one of corners of the Al layer m, and $d_2$ represents the distance between such center and one of corners of the AlN grain c.

TABLE 1

| Partial pressure of gas (Torr) | | Composite ratio $d_2/d_1$ |
|---|---|---|
| argon | nitrogen | |
| 324 | 36 | 0.31 |
| 180 | 180 | 0.41 |
| 0 | 360 | 0.46 |
| 0 | 600 | 0.54 |
| 0 | 700 | 0.59 |

It can be seen from Table 1 that the composite ratio is increased as the partial pressure of nitrogen gas is increased. In this case, if the particle size is equal to a value twice the distance $d_1$ in the composite particulate P, the composite particulates P have an average particle size in a range of 40 to 120 nm and thus, are ultra-fine.

Examples of grain-reinforced type structural members made using the composite particulates will be described below.

EXAMPLE 1

In producing a structural member, the composite particulates are used alone or in combination with other metal simple particulates having a single crystal structure and are subjected in sequence to compacting and sintering processes, whereby the metal layers of the composite particulates are bonded to one another to provide a structural member. When a starting powder comprising composite particulates and metal-simple particulates is used, the volume fraction Vf of the ceramic grains present in the composite particulates with respect to the entire member is set at a value of at least 1%.

Because there is no dislocation, fault, crystal grain boundary, etc., produced in the metal layer of the single crystal structure or the like, the metal layer has a low chemical activity and hence, has a characteristic that it is hard to oxidize, as described above. This ensures that the sintering between the particulates can be reliably effected at the sintering stage, thereby providing a high density and high strength structural member with ultra-fine ceramic grains uniformly dispersed in the metal matrix.

A particular example now will be described. The starting powder was formed of composite particulates having an average particle size of 100 nm and Al alloy particulates having an average particle size of 100 nm (2024 material). The starting powder was subjected to a compacting process at a pressing force of 4 t/cm² to provide a green compact having a diameter of 10 mm, a thickness of 3 mm and a relative density of 85%. Then, the green compact was subjected to a sintering process in a vacuum for 12 hours to produce a structural member. In this case, the volume fraction Vf of AlN grains is 10%.

Figure 4:
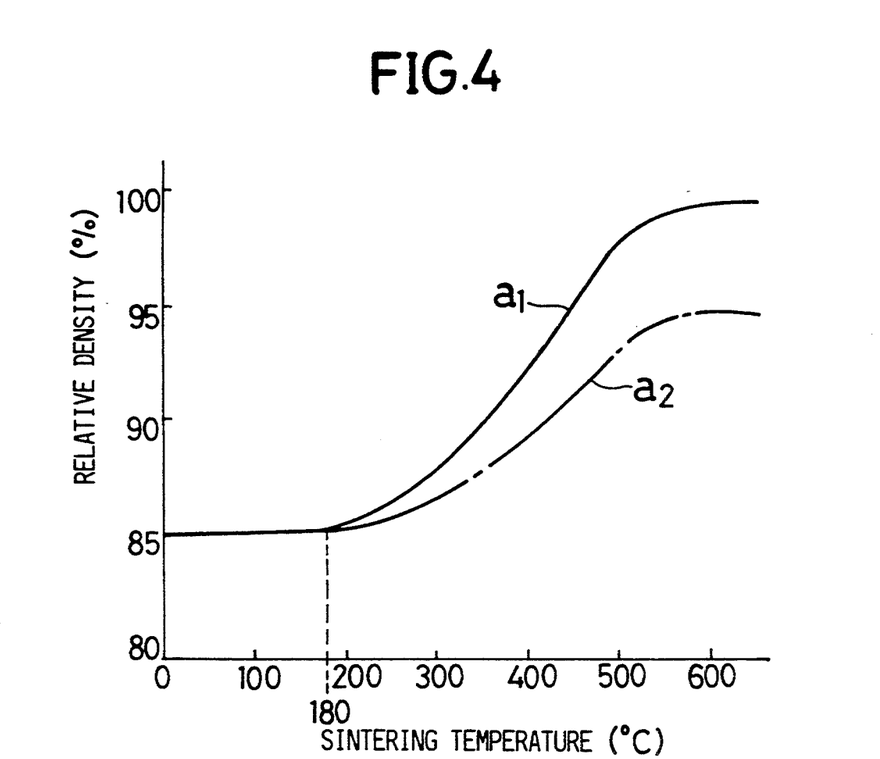
FIG. 4 is a graph illustrating the relationship between the sintering temperature and the relative density.

The line $a_1$ in FIG. 4 indicates the relationship between the sintering temperature and the relative density for the structural member. The line $a_2$ in FIG. 4 indicates such a relationship for a comparative example produced under the same conditions using Al alloy particulates (2024 material) having a polycrystalline structure and an average particle size of 100 nm.

As apparent from the comparison of the lines al and $a_2$, the sintering is started at a temperature on the order of 180° C., wherein an increase in relative density is observed, but the degree of progress of the subsequent sintering for the structural member indicated by the line $a_1$ is increased rapidly, as compared with the comparative example indicated by the line $a_2$.

The generation of such a phenomenon in the structural member indicated by the line $a_1$ is due to the fact that both the metal layer m and the Al alloy particules are of a single crystal structure and have no oxide layer on their surfaces, or have a very small amount, if any, of an oxide layer. With the comparative example indicated by the line $a_2$, on the other hand, the generation of such a phenomenon is due to the fact that the Al alloy particulates are very fine and of the polycrystalline structure and hence, the surface of the particulate is covered with the oxide layer.

EXAMPLE 2

Starting powders comprising various composite particulates and Al alloy particulates (2024 material) were used and subjected to a compacting process under a pressing force of 4 t/cm² to provide green compacts having a diameter of 80 mm and a length of 70 mm. Then, the green compacts were subjected to an extrusion under conditions of a temperature of 450° C., an extrusion ratio of 13.0 and an extrusion speed of 1 mm/sec., thereby providing various structural members.

Figure 5:
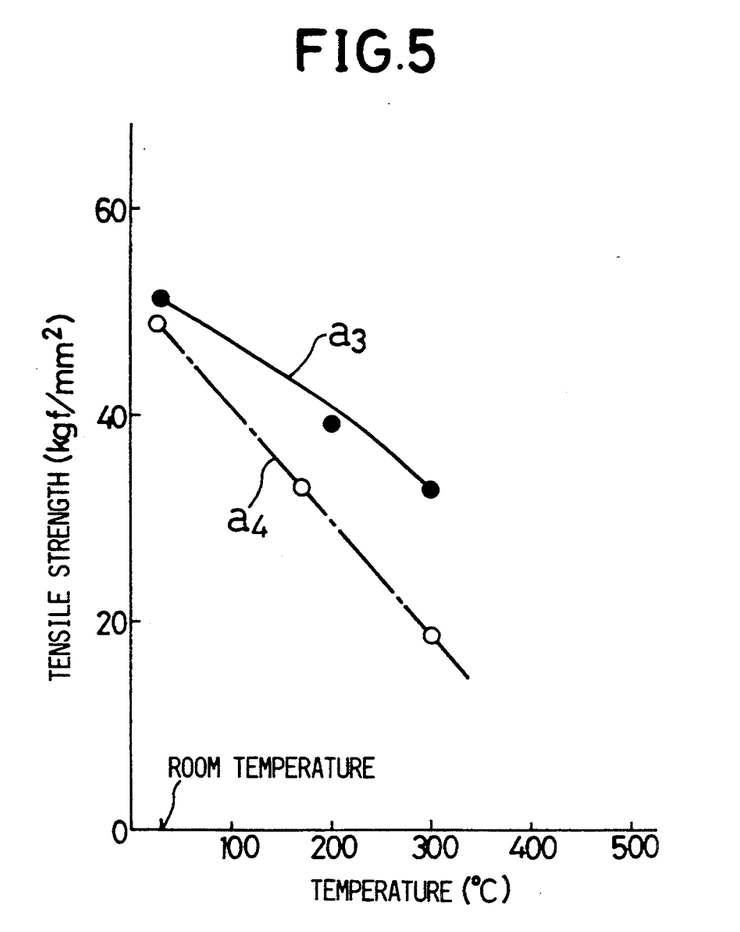
FIG. 5 is a graph illustrating the results of a tension test.

FIG. 5 illustrates the relationship between the temperature and the tensile strength for the two structural members. In FIG. 5 the line $a_3$ indicates the tensile strength $\sigma_B$ of the structural member according to the present invention, wherein the volume fraction Vf of the AlN grains is 20%, and the grain size of the AlN grain is 100 nm. The line $a_4$ indicates the tensile strength $\sigma_B$ of a comparative example which has been produced in the same process using starting powder comprising composite particulates containing SiC grains with their surfaces each covered with an Al layer, and Al alloy particulates (2024 material). In this case, the volume fraction Vf of the SiC grains is 20%, and the grain size of the SiC grain is 4 μm.

It can be seen from FIG. 5 that the structural member according to the present invention has a high strength at a high temperature, as compared with the comparative example.

This is because, in the structural member according to the present invention, the crystal orientations of both the AlN grain and Al layer are equal due to the epitaxy growth of the Al layers on the surfaces of the AlN grains both having a single crystal structure, and therefore, the bonding strength between the AlN grain and the Al layer and thus between the AlN grains and the Al alloy matrix is high, and the difference in thermal expansion between both of them is small and moreover, the AlN grains are very fine and uniformly dispersed in the Al alloy matrix. In the comparative example, the deterioration of the strength at a high temperature is considerable, because the difference in thermal expansion between the SiC grain and the Al layer is large, and a peel-off between the layers is produced.

EXAMPLE 3

In producing a structural member, composite particulates are used alone or in combination with other polyhedron-shaped metal-simple particulates and subjected to a compacting process under pressure to provide a blank. Then, the blank is subjected to a sintering process, thereby providing a structural member containing very fine ceramic grains uniformly dispersed in a metal matrix. When a powder comprising composite particulates and metal-simple particulates is used as starting material, the volume fraction Vf of the ceramic grains present in the composite particulates with respect to the entire structural member is set at a value of at least 1%.

At the step of the compacting under pressure, the surface-to-surface contact between the polyhedron-shaped composite particulates or between the polyhedron-shaped composite particulates and the metal-simple particulates occurs, thereby permitting a high density blank to be produced.

At the sintering step, the diffusion and transfer of atoms in a region of the surface-to-surface contact are effected efficiently, which ensures that the sintering can be carried out at a temperature lower than the usual sintering temperature, thereby producing a structural member having theoretical density.

A particular example now will be described. The starting powder was formed of polyhedron-shaped composite particulates having an average particle size of 100 nm and Al alloy particulates (2024 material) having the same shape and the same average particle size as the composite particulates. And the starting powder was subjected to a compacting under a pressing force of 4 t/cm² to produce the blank.

Table 2 illustrates the structure and characteristics for various blanks. A comparative example in Table 2 was produced by compacting under the same conditions as those described above, using starting powder comprising spherical composite particulates having an average particle size and including an Al layer formed on a surface of each of spherical AlN grains by a coating treatment, and spherical Al alloy particulates (2024 material) having the same shape and the same average particle size as the composite particulates.

TABLE 2

| Blank | Volume fraction (%) | Porosity (%) | Hardness Hv |
|---|---|---|---|
| Example 1 | 7 | 4 | 80 |
| Example 2 | 10 | 4 | 160 |
| Example 3 | 16 | 5 | 170 |
| Comparative example | 10 | 15 | 50 |

It can be seen from Table 2 that the examples (1), (2) and (3) each have a high density (i.e., lower porosity and thus, each have a high hardness, as compared with the comparative example.

Then, the example 2 and the comparative example were selected from the various blanks and subjected to a sintering process under conditions of 1 atmosphere pressure, 300° C. and 24 hours to provide two structural members.

Table 3 illustrates characteristics of the example 2 and the comparative example after the sintering process.

TABLE 3

| Structural member | Relative density (%) | Hardness Hv |
|---|---|---|
| Example 2 | ≧99 | 200 |
| Comparative example | 90 | 100 |

It can be seen from Table 3 that Example (2) has a high density and a high hardness and thus, has a high strength, as compared with comparative example.

Figure 6:
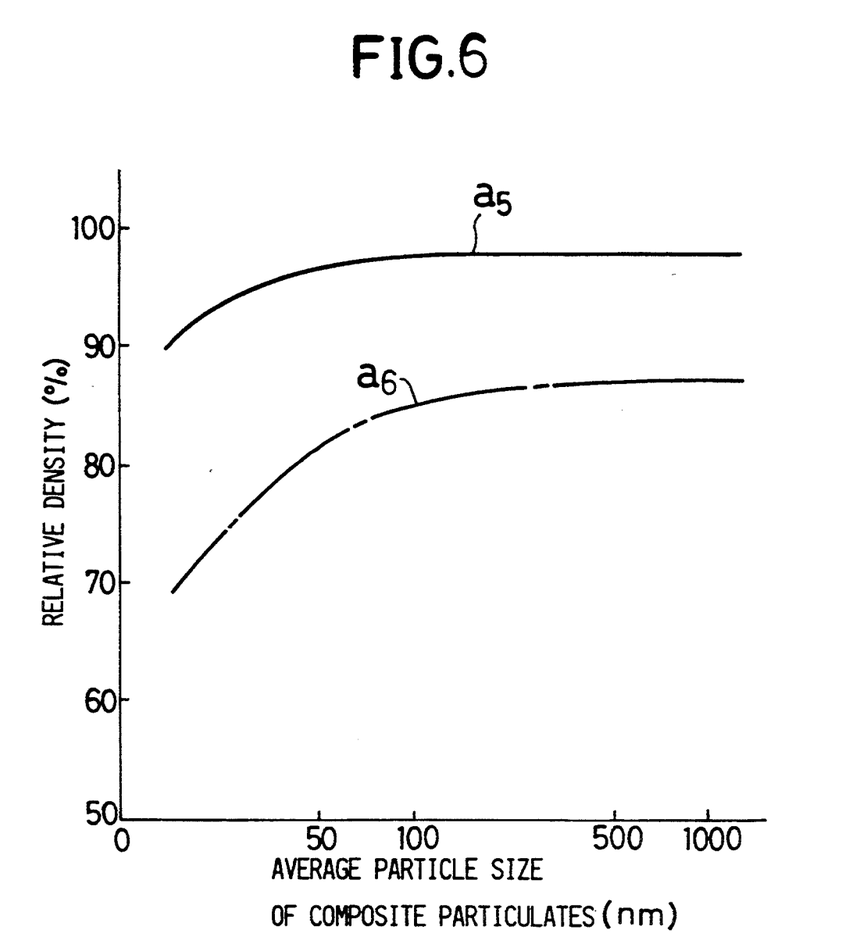
FIG. 6 is a graph illustrating the relationship between the average particle size of the composite particulates and the relative density.

FIG. 6 illustrates the relationship between the average particle size and the relative density of composite particulates in a blank. The starting powder used was of the same construction as that described above, wherein the volume fraction Vf of AlN grains was 10%. In FIG. 6, the line $a_5$ corresponds to an example of the present invention, and the line $a_6$ corresponds to a comparative example.

As can be seen from the line $a_5$, according to the present invention, it is possible to produce a blank having a substantially constant and high relative density with respect to the variation in average particle size of the composite particulates.

With the comparative example, it can be seen from the line $a_6$ that the relative density of the blank is reduced significantly, as the average particle size of the composite particulates is reduced. This is due to the fact that the blank is not sufficiently solidified, because of a poor escapement of air from between the very fine spherical particulates in the starting powder.

Figure 7:
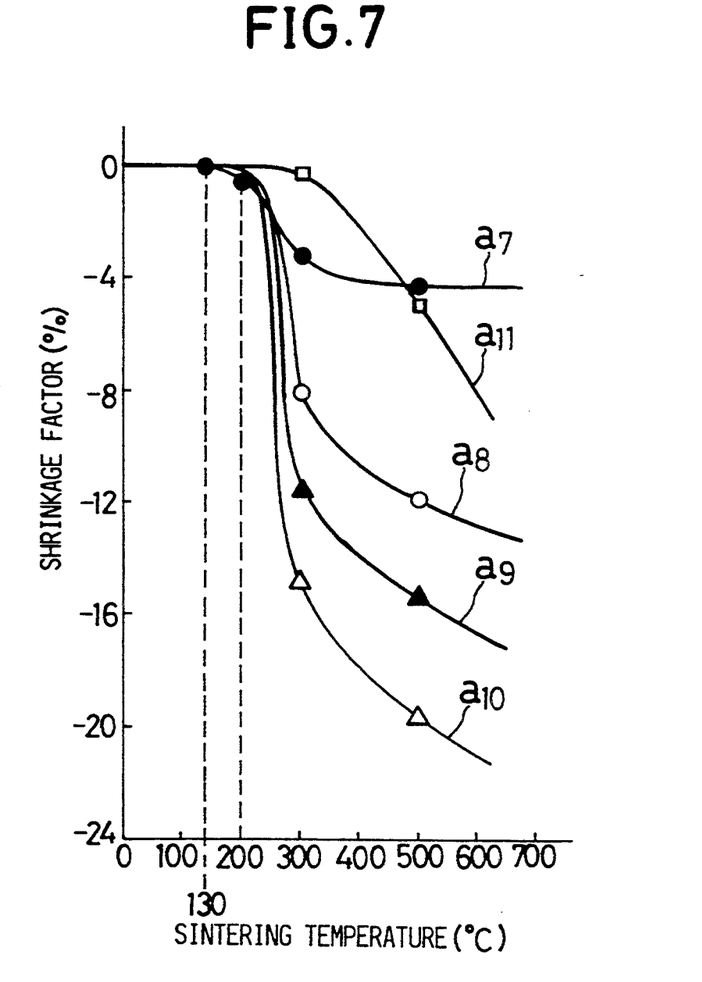
FIG. 7 is a graph illustrating the relationship between the sintering temperature and the shrinkage factor.

FIG. 7 illustrates a relationship between the sintering temperature and the shrinkage factor for blanks. The starting powder used is of the same construction as that described above (the particulates in comparative examples are spherical). The relationship between lines $a_7$ to $a_{11}$ and the average particle sizes of the composite particulates is as given in Table 4.

TABLE 4

| Line | Average particle size of composite particulates |
|---|---|
| $a_7$ | ≦100 nm (example of the present invention) |
| $a_8$ | ≦400 meshes (comparative example) |
| $a_9$ | 200 nm (comparative example) |
| $a_{10}$ | 150 nm (comparative example) |
| $a_{11}$ | 100 nm (comparative example) |

As apparent from the line $a_7$, according to the present invention, the sintering starts to cause the shrinkage of the blank at a temperature as low as about 130° C., and the shrinkage factor is approximately 4% at a sintering temperature of about 300° C. and remains substantially constant even if the sintering temperature is further increased.

In the case of the comparative examples indicated by the lines $a_8$ to $a_{10}$, the sintering starts the shrinkage of the blanks at about 200° C., wherein the shrinkage factor is abruptly increased with an increase in sintering temperature. This is due to a high residue of air in the blank. In the case of the comparative example indicated by the line all, the temperature at which the sintering is started is as high as about 300° C., and the shrinkage factor is abruptly increased with an increase in sintering temperature. This is due to a high porosity of the blank.

EXAMPLE 4

In producing a structural member, a method is employed which uses as starting powder polyhedron-shaped composite particulates alone or in combination with other metal-simple particulates and which comprises the steps of forming a blank from the starting powder and then subjecting the blank to a fabrication under pressure. When the composite particulate matter is used in combination with the metal-simple particulates, the volume fraction Vf of ceramic grains in the composite particulates relative to the entire structural member is set at a value of at least 1%.

In this fabrication under pressure, there is generated a phenomenon that the corners of the polyhedron-shaped composite particulate bite the surface of the other composite particulate or the metal simple particulate to strongly press such surface. This ensures that the destruction of an oxide layer present on the surface of the particulate is efficiently performed, and the plastic deformation of the metal portion is promoted. The destruction of the oxide layer in each of the composite particulates is further efficiently achieved, because such composite particulate contains the ceramic grain therein and moreover, is polyhedral and has a configuration difficult to rotate. In addition, the clean faces appearing on the metal layers or the surfaces of the metal simple particulates are reliably diffused and bonded together, and the metal layers are epitaxially-grown on the surfaces of the ceramic grains. As a result, the bond strength between the single crystals is high. Thus, it is possible to produce a high strength structural member comprising very fine ceramic grains uniformly dispersed in the metal matrix.

Examples of the fabrication under pressure include an extrusion, a rolling, a forging, etc. Particularly, in the extrusion, even if the speed of strain is reduced, a sufficient destruction of the oxide layer and a good plastic deformation are achieved as described above, ensuring that a structural member having a large sectional area can be produced at a low extrusion ratio. In this case, a reduction in dispersibility of the ceramic grains as a result of a reduction in speed of strain is avoided due to the uniform arrangement of the ceramic grains relative to the metal layers.

A particular example now will be described. A starting powder consisting of polyhedron-shaped composite particulates with a composite ratio of 0.59 and substantially spherical Al alloy particulates (2024 material) was used and subjected to a compacting process at a pressing force of 4 t/cm² to form a billet having a diameter of 80 mm and a length of 70 mm. Then, the billet was heated to 450° C. and then subjected to an extrusion at an extrusion ratio of 13 to produce a round rod-like structural member.

Table 5 illustrates the structure and various characteristics of the structural member produced according to the present invention ("Sample") and comparative examples (1) to (3).

The comparative example (1) was produced under the same conditions as those described above, using starting powder which comprises substantially spherical composite particulates each having an Al layer formed at a coating thickness ratio (applying correspondingly to the composite ratio) of 0.59 on a surface of each of substantially spherical SiC grains by a coating treatment, and substantially spherical Al alloy particulates (2024 material) having the same shape and the same average particle size as those of the composite particulates. The comparative example (2) was produced by replacing the SiC particulates used in the comparative example (1) by AlN particulates, and the comparative example (3) was produced using only Al alloy particulates of the type described above.

TABLE 5

| Structural member | Matrix | Ceramic grains material | Vf (%) | P.S.$\sigma_{0.2}$ (kgf/mm²) | T.S.$\sigma_B$ (kgf/mm²) | El.$\delta$ (%) |
|---|---|---|---|---|---|---|
| Sample | Al alloy | AlN | 20 | 55 | 60 | 1.0 |
| Co. Ex. (1) | Al alloy | SiC | 20 | 46 | 54 | 1.8 |
| Co. Ex. (2) | Al alloy | AlN | 20 | 38 | 46 | 2.0 |
| Co. Ex. (3) | Al alloy | — | — | 30 | 40 | 12 |

Vf = Volume fraction P.S. = Proof strength T.S. = Tensile strength El. = Elongation Co. Ex. = Comparative example As apparent from Table 5, it can be seen that the structural member according to the present invention has a high strength, as compared with the comparative examples (1) to (3).

EXAMPLE 5

Starting powders comprising various composite particulates and Al alloy particulates (2024 material) were used and pressurized at a pressing force of 4 t/cm² to provide green compacts each having a diameter of 80 mm and a length of 70 mm. Then, the green compacts were extruded under conditions of a temperature of 450° C., an extrusion ratio of 13.0 and an extrusion speed of 1 mm/sec to give various structural members.

Figure 8:
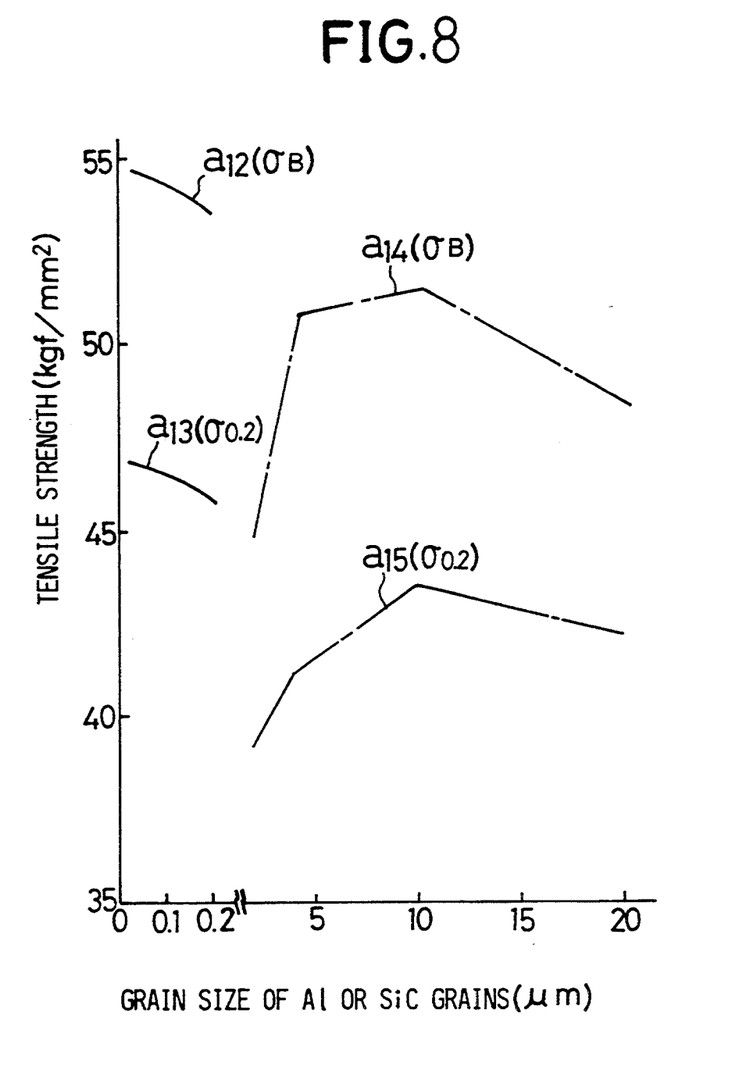
FIG. 8 is a graph illustrating the results of a tension test.

FIG. 8 illustrates results of a tension test for the various structural members. In FIG. 8, the line $a_{12}$ indicates the tensile strength $\sigma_B$ of the structural member produced according to the present invention, and the line $a_{13}$ indicates the proof strength 0.2% $\sigma_{0.2}$ of the structural member produced according to the present invention. In this case, the volume fraction Vf of the AlN grains is 20%, and the composite ratio is 0.59.

The line $a_{14}$ indicates the tensile strength $\sigma_B$ of the comparative example, and the line $a_{15}$ indicates the proof strength 0.2% $\sigma_{0.2}$ of the comparative example. This comparative example was produced in the same manner as that described above, using starting powder which comprises composite particulates containing spherical SiC grains each having thereon an aluminum layer by coating, and Al alloy particulates. Therefore, the grain size of the SiC grains in this comparative example is extremely large, as compared with the AlN grains in the structural member of the present invention. In this case, the volume fraction Vf of the SiC grains is 20%, and the coating thickness ratio (applying correspondingly to the composite ratio) is 0.59.

It can be seen from FIG. 8 that the structural member produced according to the present invention has a substantially increased strength, as compared with the comparative example. This is due to the fact that the AlN grains are very fine and that the surface energy of the AlN grains has been reduced by the Al layers, so that the composite particulates have been uniformly dispersed without being coagulated.

It will be understood that the composite particulates can be deposited onto the substrate 8 (see FIG. 1), while at the same time, the metal layers thereof can be bonded together, thereby producing a structural member containing ultra-fine ceramic grains uniformly dispersed in the metal matrix. In this case, an extruding step or a sintering step under a pressure may be employed as a subsequent step. In addition, it will be understood that the composite particulates P used in the present invention includes composite particulates containing ceramic grains c each having a surface that is not completely covered by a metal layer m without departing from this invention.

What is claimed is:

1. A high strength structural member which is formed from metal-based particulates that are bonded together, said particulates being each formed, at least at their surface side, of a metal having a single crystal structure.

2. A high strength structural member according to claim 1, wherein at least some of said metal-based particulates are composite particulates each comprising a ceramic grain with its surface covered by the metal having a single crystal structure, said ceramic grain having an aspect ratio.

3. A high strength structural member according to claim 2, wherein said ceramic grain has a single crystal structure.

4. A high strength structural member according to claim 1, 2 or 3, wherein said metal-based particulate is polyhedron-shaped.

5. A high strength structural member according to claim 2 or 3, wherein each of said composite particulates comprises an octahedral AlN grain of a single crystal structure having a hexagonal cross section, and an octahedral Al layer of a single crystal structure which covers the surface of the AlN grain and which has a hexagonal cross section.

6. A process for producing a high strength structural member, comprising the steps of:
forming a blank under pressure by use of starting powder comprised of polyhedron-shaped metal-based particulates, at least some of said particulates being formed, at least at their surface sides, of a metal having a single crystal structure, and
subjecting said blank to a sintering treatment.

7. A process for producing a high strength structural member according to claim 6, wherein each of said some particulates is a composite particulate which comprises a ceramic grain with its surface covered by the metal having a single crystal structure.

8. A process for producing a high strength structural member, comprising the steps of:
forming a blank by use of starting powder, at least some of said starting powder being polyhedron-shaped metal-based particulates, each of said particulates being formed, at least at their surface side, of a metal having a single crystal structure, and
subjecting said blank to a fabrication process under pressure.

9. A process for producing a high strength structural member according to claim 8, wherein each of said polyhedron-shaped metal-based particulates is a composite particulate which comprises a ceramic grain with its surface covered by the metal having a single crystal structure.

10. A process producing a high strength structural member, comprising the steps of:
producing ceramic grains by a reaction of a metal vapor with an atmosphere gas,
covering the surface of each of said ceramic grains with a metal layer having a single crystal structure and produced from said metal vapor, thereby providing polyhedron-shaped composite particulates each comprised of the ceramic grain and the metal layer, and
bonding the metal layer of a plurality of said composite particulates together.

11. A process for producing a high strength structural member according to claim 7, 9 or 10, wherein said ceramic grain has a single crystal structure.

12. A process for producing a high strength structural member according to claim 7, 9 or 10, wherein each of said composite particulates comprises an octahedral AlN grain of a single crystal structure having a hexagonal cross section, and an octahedral Al layer of a single crystal structure which covers the surface of the AlN grain and which has a hexagonal cross section.

13. A process for producing a high strength structural member, comprising the steps of:
forming a blank under pressure from polyhedron-shaped metal-based particulates; and
subjecting said blank to a sintering treatment.

14. A process for producing a high strength structural member according to claim 13, wherein at least some of the metal-based particulates forming said blank are composite particulates each comprising a ceramic grain with its surface covered by a metal layer.

15. A process for producing a high strength structural member, comprising the steps of:

forming a blank by use of starting powder, at least some of said starting powder being polyhedron-shaped metal-based particulates; and subjecting said blank to a fabrication process under pressure.

16. A process for producing a high strength structural member according to claim 15, wherein each of said polyhedron-shaped metal-based particulates is a composite particulate comprising a ceramic grain with its surface covered by a metal layer.

17. A process for producing a high strength structural member, comprising the steps of:
producing ceramic grains by a reaction of a metal vapor with an atmosphere gas,
covering the surface of each of said ceramic grains with a metal layer produced from said metal vapor, thereby providing polyhedron-shaped composite particulates each consisting of the ceramic grain and the metal layer, and
bonding the metal layer of a plurality of said composite particulates together.

18. A high strength structural member according to claim 1, wherein at least some of said metal-based particulates are composite particulates each comprising a ceramic grain with its surface covered by the metal having a single crystal structure, said ceramic grain having a single crystal structure.

19. A high strength structural member which is formed of metal-based particulates bonded together, wherein at least some of said metal-based particulates are composite particulates each comprising a ceramic grain with its surface covered at least partly with a layer of a metal having a single crystal structure, said ceramic grain having an aspect ration (L/D).

20. A high strength structural member according to claim 19, wherein said ceramic grain has a Single crystal structure.

21. A high strength structural member according to claim 19, wherein at least some of said metal-based particulates are polyhedron-shaped.

22. A high strength structural member according to claim 19, wherein each of said composite particulates comprises an octahedral AlN grain of a single crystal structure having a hexagonal cross section, and an octahedral Al layer of a single crystal structure which covers the surface of the AlN grain and which has a hexagonal cross section.

23. A high strength structural member according to claim 19, wherein said metal is one element selected from the group consisting of Fe, Al and Ti or an alloy of the element.

24. A high strength structural member according to claim 19, wherein said ceramic grain is one of nitride, carbide, boride or oxide.

25. A high strength structural member according to claim 19, wherein the volume fraction (Vf) of the ceramic grains in the composite particulates with respect to the entire structural member is greater than or equal to 1%.

26. A process for producing a high strength structural member by forming a blank from a starting powder formed of metal-based particulates and subjecting the blank to a fabrication step, the process comprising the steps of:
preparing at least some of said metal-based particulates as composite particulates which are each formed of a ceramic grain and a metal layer having a single crystal structure which covers at least a part of the surface of the ceramic grain;
forming the blank by bonding a plurality of the metal-based particulates together using the metal layer on the surface of each of the composite particulates.

27. A process according to claim 26, wherein said composite particulates are prepared by producing ceramic grains by reaction of a metal vapor with an atmosphere gas and covering the surface of each ceramic grain with the metal layer produced from the metal vapor.

28. A process according to claim 27, wherein said metal is one element selected from the group consisting of Fe, Al and Ti or an alloy of the element.

29. A process according to claim 27 or 28, wherein said atmosphere gas is one selected from the group consisting of nitrogen ($N_2$) gas, oxygen ($O_2$) gas, methane ($CH_4$) gas, and diboron gas.

30. A process according to claim 29, wherein argon gas is additionally used as the atmosphere gas.

31. A process according to claim 26, wherein said ceramic grain is one of nitride, carbide, boride or oxide.

32. A process according to claim 26, wherein said blank is formed under pressure and is then subjected to a sintering treatment.

33. A process according to clam 26, wherein said blank is formed under pressure and is then subject to an extrusion.

34. A process according to claim 26, wherein each ceramic grain is formed to have a single crystal structure.

35. A process according to claim 26, wherein at least some of said metal-based particulates are polyhedron-shaped.

36. A process according to claim 26, wherein each of said composite particulates comprises an octahedral AlN grain of a single crystal structure having a hexagonal cross section, and an octahedral Al layer of a single crystal structure which covers the surface of the AlN grain and which has a hexagonal cross section.

37. A process according to claim 26, wherein the volume fraction (Vf) of the ceramic grains in the composite particulates with respect to the entire structural member is greater than or equal to 1%.

* * * * *